United States Patent [19]

Kim

[11] Patent Number: 5,315,141
[45] Date of Patent: May 24, 1994

[54] SEMICONDUCTOR MEMORY DEVICE HAVING A DOUBLE-STACKED CAPACITOR STRUCTURE

[75] Inventor: Jae K. Kim, Kyoungki, Rep. of Korea

[73] Assignee: Hyundai Electronics Industries Co., Ltd., Kyungki, Rep. of Korea

[21] Appl. No.: 122,100

[22] Filed: Sep. 16, 1993

Related U.S. Application Data

[62] Division of Ser. No. 887,544, May 22, 1992, Pat. No. 5,270,238.

[30] Foreign Application Priority Data

May 24, 1991 [KR] Rep. of Korea ............... 91-8407

[51] Int. Cl.$^5$ .................................. H01L 29/94
[52] U.S. Cl. .................... 257/308; 257/306; 257/385
[58] Field of Search ............ 257/306, 308, 303, 296

[56] References Cited

U.S. PATENT DOCUMENTS

| | | | |
|---|---|---|---|
| 4,953,126 | 8/1990 | Ema | 257/306 |
| 4,974,040 | 11/1990 | Taguchi et al. | 257/306 |
| 5,006,481 | 4/1991 | Chan et al. | 257/911 |
| 5,059,548 | 10/1991 | Kim | 257/307 |
| 5,126,280 | 6/1992 | Chan et al. | 257/309 |

Primary Examiner—Robert Limanek
Attorney, Agent, or Firm—Jay H. Maioli

[57] ABSTRACT

A semiconductor memory device having a double-stacked capacitor, and methods for manufacturing the same, are disclosed. Such memory device has a first stacked capacitor and a second stacked capacitor, which are formed respectively over and below a bit line and run in parallel and are connected in order to increase the capacity of the capacitors and to prevent contact faults caused by a step occurring.

2 Claims, 5 Drawing Sheets

"Prior Art"

SEMICONDUCTOR MEMORY DEVICE HAVING A DOUBLE-STACKED CAPACITOR STRUCTURE

This is a division of application Ser. No. 07/887,544 filed May 22, 1992 now U.S. Pat. No. 5,270,238.

BACKGROUND OF INVENTION

1. Field of the Invention

The invention relates to a semiconductor memory device having a double-stacked capacitor structure and to methods for manfacturing the same, and more particularly to a semiconductor memory device having a double-stacked capacitor structure wherein one of the stacked capacitors is formed over and one is formed below a bit line and to methods for manufacturing the same.

2. Information Disclosure Statement

Generally, as the integration ratio of a semiconductor memory device increases, the unit area required for constituting the unit memory cell decreases and the capacity of the capacitor also decreases. Therefore, a semiconductor memory device not having a plate-type capacitor structure but rather having a trench-type capacitor structure or stacked-type capacitor structure has been developed, in order to enhance the capacity of the capacitor.

However, as the integration ratio of the semiconductor memory device increases greatly, the ability to obtain a highly-integrated memory device in a limited unit cell area of a single capacitor structure is limited.

In order to overcome such limitations, a multiple-stacked capacitor has been developed, which is disclosed in an article entitled "3-dimensional stacked capacitor for 16 mega byte and 64 mega byte DRAM", IEEE, 592-595 IEDM 88. As shown in FIG. 4, the multiple-stacked capacitor consists of a charge storage electrode 32 of a multiple layer which is connected to a source electrode 4 of MOSFETS. A bit line electrode 30 is formed below the plate of the charge storage electrode 32 and is connected to a drain electrode 4' of said MOSFETS. The drawing also shows a gate electrode 3, plate electrode 33, field oxide layer 2 and insulating layer 31.

However, under the above-mentioned prior art, there are difficulties in manufacturing the multiple-stacked structure capacitor, and the bit line contact or charge storage electrode contact of the stacked capacitor ceases or fails to be a proper contact due to a step occurring.

Therefore, it is an objective of the present invention to solve the problems set forth above and to provide a semiconductor memory device having a double-stacked capacitor structure, having a first-stacked capacitor, and a bit line formed thereover, and a second-stacked capacitor formed over the bit line, and to provide methods for manufacturing the same.

SUMMARY OF THE INVENTION

A semiconductor memory device having a double-stacked capacitor structure, and methods for manufacturing the same, in accordance with the present invention, are defined by the claims with specific embodiments shown in the attached drawings. For the purpose of summarizing the invention, the invention and relevant portions of the embodied methods for manufacturing the same relate to a semiconductor memory device having a double-stacked capacitor structure, said device being initially comprised of MOSFETs each with a gate electrode, a source electrode and a drain electrode formed on a substrate. A first charge storage electrode is placed in contact with a source electrode of said MOSFETs through a first contact hole and extended over a part of said gate electrode, with an insulating layer then being placed between said first charge storage electrode and the MOSFETS. A first (first-stacked) capacitor, having a first dielectric layer and a first plate electrode, sequentially, is formed over said first charge storage electrode. A second and a third insulating layer are sequentially formed over said first plate electrode, with a bit line then (next) being formed between said second insulating layer and third insulating layer, said bit line then (next) being placed in contact with a drain electrode of said MOSFETs through a second contact hole. A third contact hole is formed over said first charge storage electrode, by removing a part of said second and third insulating layer, a part of said first plate electrode and a part of said first dielectric layer. A second charge storage electrode is formed over said third insulating layer, and placed in contact with said first charge storage electrode through said third contact hole, with an insulating spacer then (next) being formed on the side walls of said third contact hole. Next, a second (second-stacked) capacitor, having a second dielectric layer and a second plate electrode sequentially, is formed over said second charge storage electrode, whereby the said first and second capacitors are arranged to take form so as to be connected and run in parallel respectively below and over said bit line.

A method for manufacturing a semiconductor memory device, having a double-stacked capacitor structure, in accordance with the first embodiment of the present invention is comprised of the following steps.

MOSFETs, each with a gate electrode, a source electrode and a drain electrode, are formed on a substrate. Then a first insulating layer is formed over said MOSFETS. The portion of said first insulating layer which portion is over a said source electrode is removed so as to form a first contact hole.

A first charge storage electrode placed in contact with said source electrode is formed through said first contact hole and extended over a part of the adjacent gate electrode. Sequentially a first dielectric layer and a first plate electrode are formed over said first charge storage electrode. A second insulating layer is formed over the whole structure (including said first plate electrode). The portions of said first and second insulating layers over said drain electrode are removed so as to form a second contact hole. A bit line in contact with said drain electrode is formed through said second contact hole. A third insulating layer is formed over the whole structure (including said bit line). The portions of said second and thud insulating layers, of said first plate electrode, and of said first dielectric layer over said first charge storage electrode are removed so as to form a third contact hole. A layer of insulation material for the manufacture of the insulating spacer which will be formed later ("insulating layer for spacer") is deposited over the third contact hole. Anisotropically said insulation material is etched into so as to form an insulating spacer on the side walls of said third contact hole. A second charge storage electrode, in contact with said first charge storage electrode, is formed, through said third contact hole, over said third insulating layer.

Finally, sequentially a second dielectric layer and a second plate electrode are deposited over said second charge storage electrode, whereby a first and a second capacitor, connected on one side and running in parallel, are formed respectively below and over said bit line.

Another method for manufacturing a semiconductor memory device, having a double-stacked capacitor structure, in accordance with the second embodiment of the present invention is comprised of the following steps. MOSFETS, each with a gate electrode, a source electrode and a drain electrode, are formed on a substrate. Then a first insulating layer is formed over said MOSFETS. The portion of said first insulating layer over a said source electrode is removed so as to form a first contact hole. A first charge storage electrode, in contact with said source electrode, is formed through said first contact hole and extended over a part of the adjacent gate electrode. Sequentially a first dielectric layer and a first plate electrode are formed over said first charge storage electrode. A second insulating layer is formed over the whole structure (including said first plate electrode). The portions of said first and second insulating layers over said drain electrode are removed so as to form a second contact hole. A bit line in contact with said drain electrode is formed through said second contact hole. Sequentially a third insulating layer and a silicon layer for a second charge storage electrode are formed over the whole structure (including said bit line). The portions of said silicon layer (for a second charge storage electrode) over, of said second and third insulating layers over, of said first plate electrode over, and of said first dielectric layer over said first charge storage electrode are removed so as to form a third contact hole. An insulating layer for spacer is deposited over the third contact hole. Anisotropically said insulating layer for spacer is etched into so as to form an insulating spacer on the side walls of said third contact hole. A conductive layer for said second charge storage electrode, which layer is in contact with said first charge storage electrode, is formed, through said third contact hole, over said silicon layer for said second charge storage electrode. Portions of said conductive layer and silicon layer for second charge storage electrode are etched into so as to actually fully form the said second charge storage electrode. Then, sequentially a second dielectric layer and a second plate electrode are deposited over said second charge storage electrode, whereby a first and a second capacitor, connected on one side and running in parallel, are formed respectively below and over said bit line.

The more practical and important pertinent features of the present invention have been outlined above in order that the detailed description of the invention which follows will be better understood and that the present contribution to the art can be fully appreciated. Additional features of the invention and methods described hereinafter form the subject of the claims of the invention. Those skilled in the art can appreciate that the conceptions and the specific embodiments diclosed herein may be readily utilized as a basis for modifying or designing other, equivalent structures for carrying out the same purposes as those of the present invention.

Further, those skilled in the art can realize that such equivalent constructions do not depart from the spirit and scope of the invention as set forth in the claims.

BRIEF DESCRIPTION OF THE DRAWINGS

For a fuller understanding of the nature and objectives of the invention, reference should be made to the following Detailed Description taken in conjunction with the accompanying drawings, a summarized brief description of which drawings follows.

Respective reference characters noted in the Detailed Description below relate to the corresponding similar reference characters describing the applicable respective parts depicted throughout the respective several views of the drawings.

DETAILED DESCRIPTION OF THE INVENTION

Figure 1:
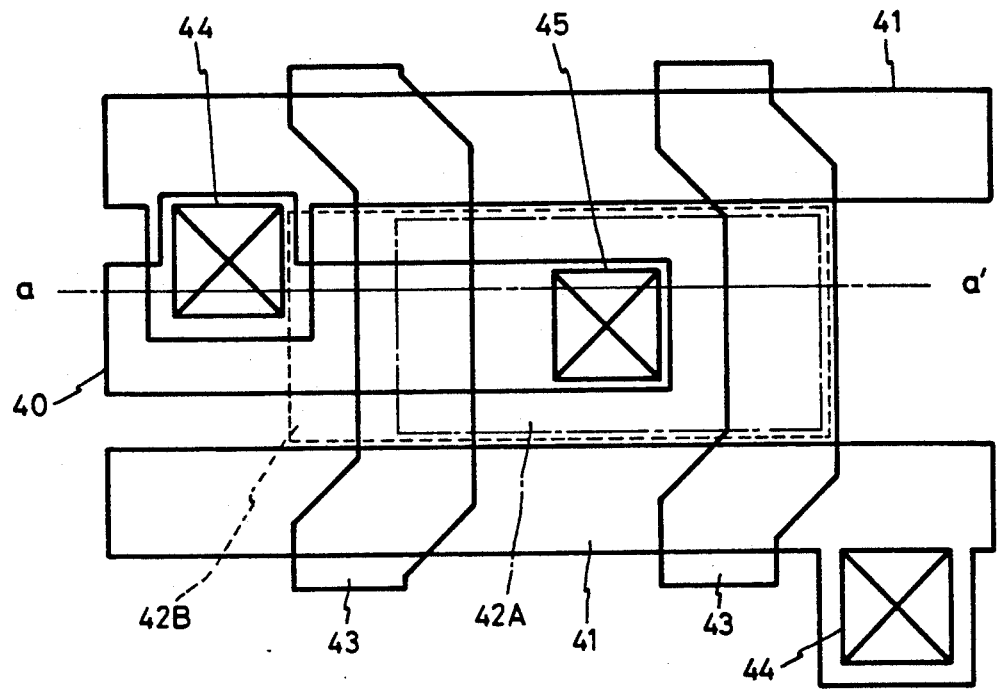
FIG. 1 is a layout of a semiconductor memory device having a double-stacked capacitor structure, in accordance with the present invention.

FIG. 1 is a layout of a semiconductor memory device having a double-stacked capacitor.

Referring to FIG. 1, an active region 40, a first charge storage electrode region 42A, a second charge storage electrode region 42B, a bit line contact region 44, a word line region 43, a bit line region 41 and a first and second charge storage electrode contact region 45 are illustrated.

FIGS. 2A through FIG. 2F depict process steps for the manufacture of a semiconductor memory device having a double-stacked capacitor, in accordance with the first embodiment of the present invention.

Figure 2A:
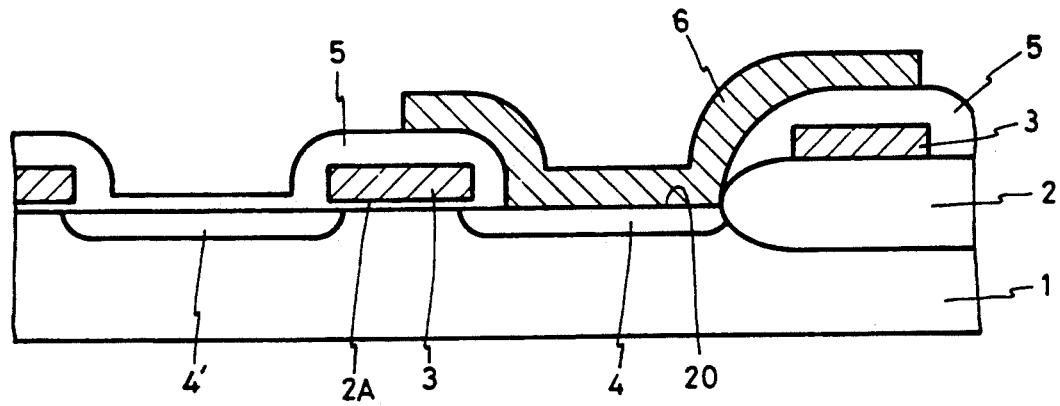
FIGS. 2A through 2F depict process steps for the manufacture of a semiconductor memory device having a double-stacked capacitor structure, in accordance with the first embodiment of the present invention.

Referring to FIG. 2A, a field oxide layer 2 and a gate oxide layer 2A are formed on a silicon substrate 1. A MOSFET with a gate electrode, a source electrode 4 and drain electrode 4' are formed on the silicon substrate 1.

Next, a first insulating layer 5 is deposited on the whole structure, and then a portion of the first insulating layer 5 over the source electrode 4 is etched into to the desired depth, thereby forming a first contact hole 20.

Thereafter a first charge storage electrode 6 is connected with a source electrode 4 as shown in FIG. 2A.

It should be noted that the first charge storage electrode can be connected with the source electrode 4 via a self-align process.

Figure 2B:
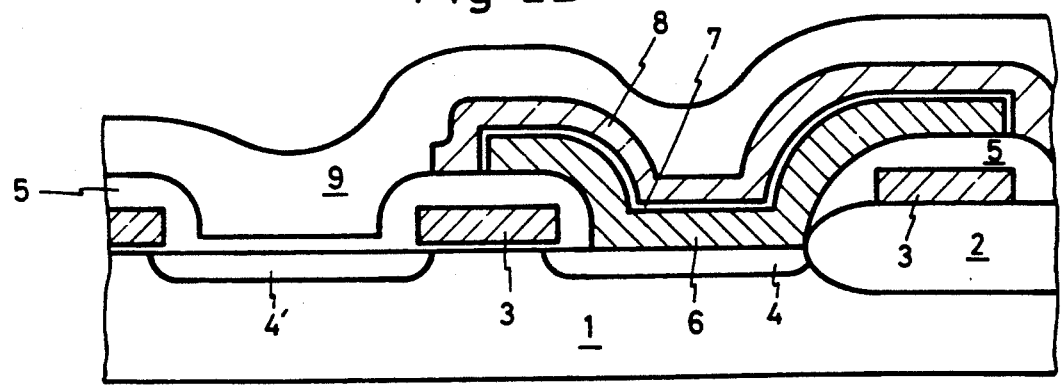

Referring to FIG. 2B, a first capacitor dielectric layer 7 is deposited on the first charge storage electrode 6 and the first plate electrode 8 is formed on the first capacitor dielectric layer 7, thereby forming a first (first-stacked) capacitor.

Next, a second insulating layer 9 which consists of a layer of Boro-Phospho-Silicate-Glass (BPSG), or consists of double layers one of BPSG and one of Undoped-Silicate-Glass (USG) respectively, is deposited on the whole structure.

It should be noted that, if necessary, the second insulating layer 9 can be formed so that said layer has a flat surface.

Figure 2C:
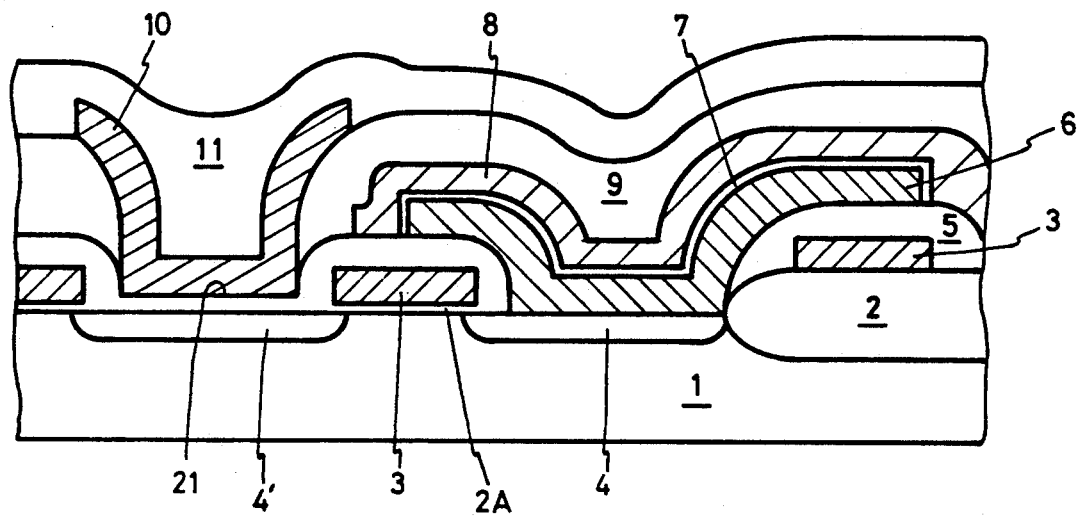

Referring to FIG. 2C, portions of the second insulating layer 9 and the first insulating layer 5 over the drain electrode 4' are etched into to the desired depth, thereby forming a second contact hole 21.

Next, a bit line 10 is connected with the drain electrode 4' and a third insulating layer 11 is deposited over the whole structure.

It should be noted that, if necessary, the third insulating layer 11 can be formed so that said layer has a flat surface.

Figure 2D:
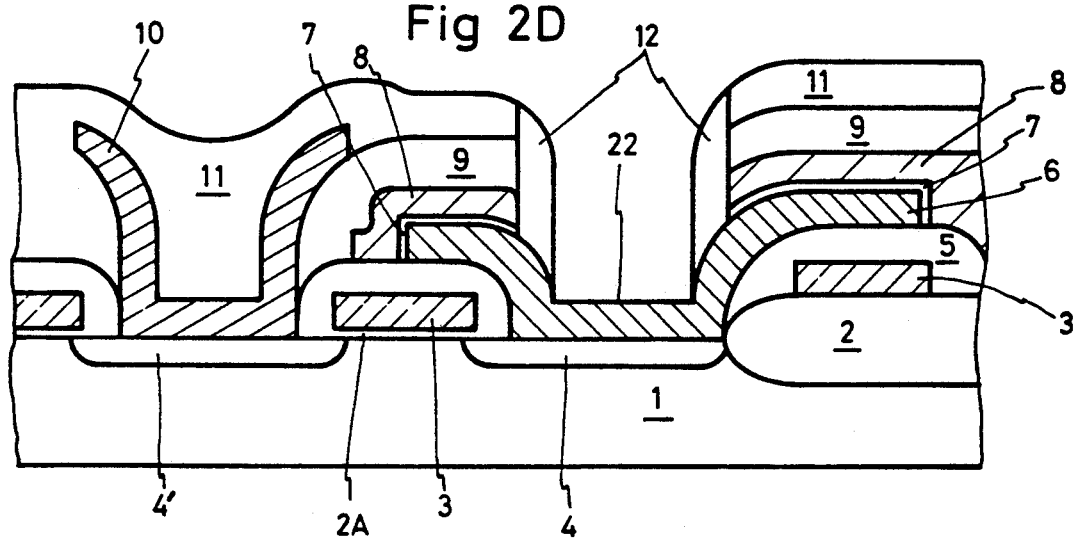

Referring to FIG. 2D, portions of, sequentially, the third insulating layer 11, the second insulating layer 9, the first plate electrode 8 and the first dielectric layer 7 are etched into to expose the first charge storage electrode 6, thereby forming a third contact hole 22.

Next, a layer of insulation material for the manufacture of the insulation spacer which will be formed later, i.e., an insulating layer for spacer (as previously defined), is deposited over the third contact hole 22. Thereafter, a desired portion of the insulating layer for spacer is removed via an etch-back process so that an insulating spacer 12 is formed on the side walls of the third contact hole 22. The insulating spacer 12 insulates the first plate electrode 8 from the second charge storage electrode which will be formed later.

Figure 2E:
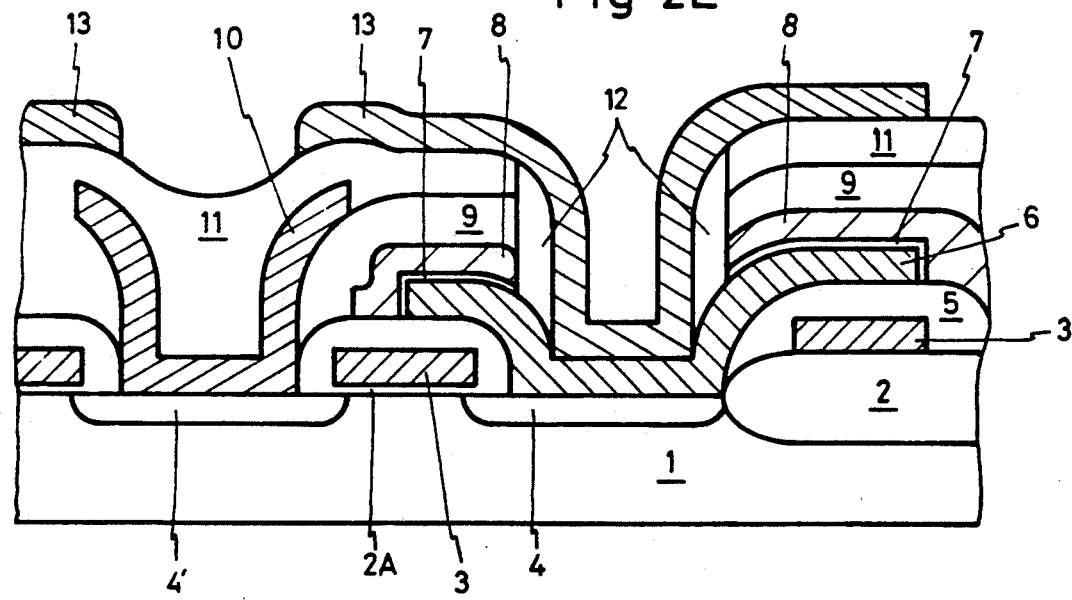

Referring to FIG. 2E, a second charge storage electrode 13 is connected with the first charge storage electrode 6 through the third contact hole 22, thereby electrically connecting the second charge storage electrode 13 to the source electrode 4 through the first charge storage electrode 6.

Figure 2F:
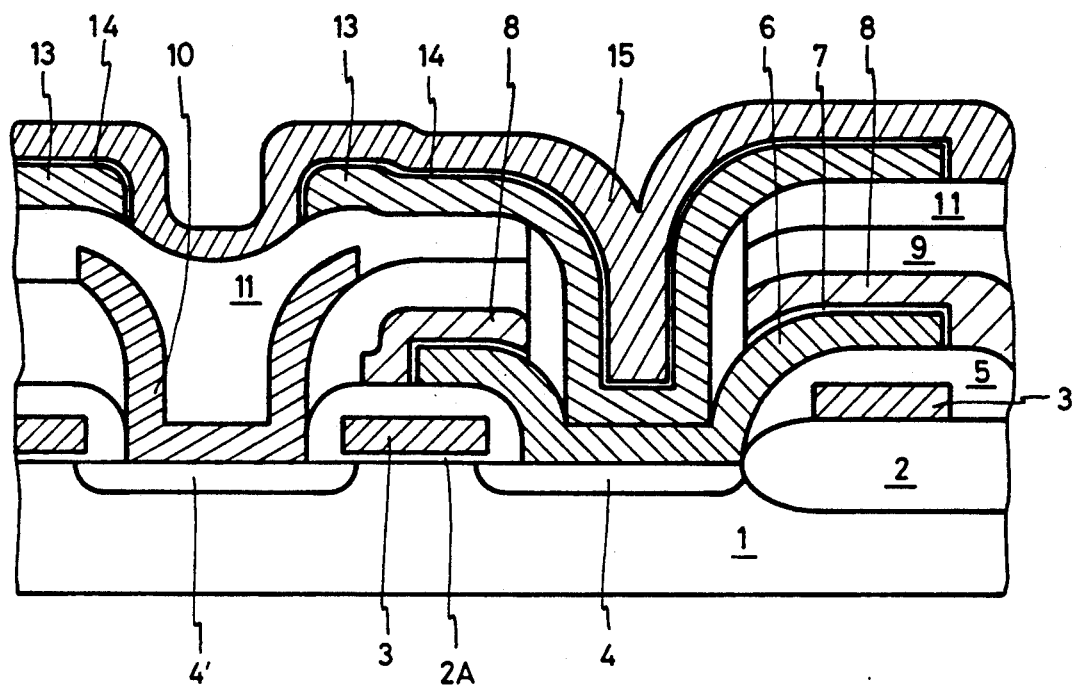

FIG. 2F illustrates a cross-section of a semiconductor memory device having a double-stacked capacitor, in which a second capacitor dielectric layer 14 is deposited on the second charge storage electrode 13 and, next, a second plate electrode 15 is formed on the second capacitor dielectric layer 14, thereby forming a second (second-stacked) capacitor. Here, the first plate electrode 8 and the second plate electrode 15 are depicted; said plate electrodes run in parallel and are connected one side.

Figure 3A:
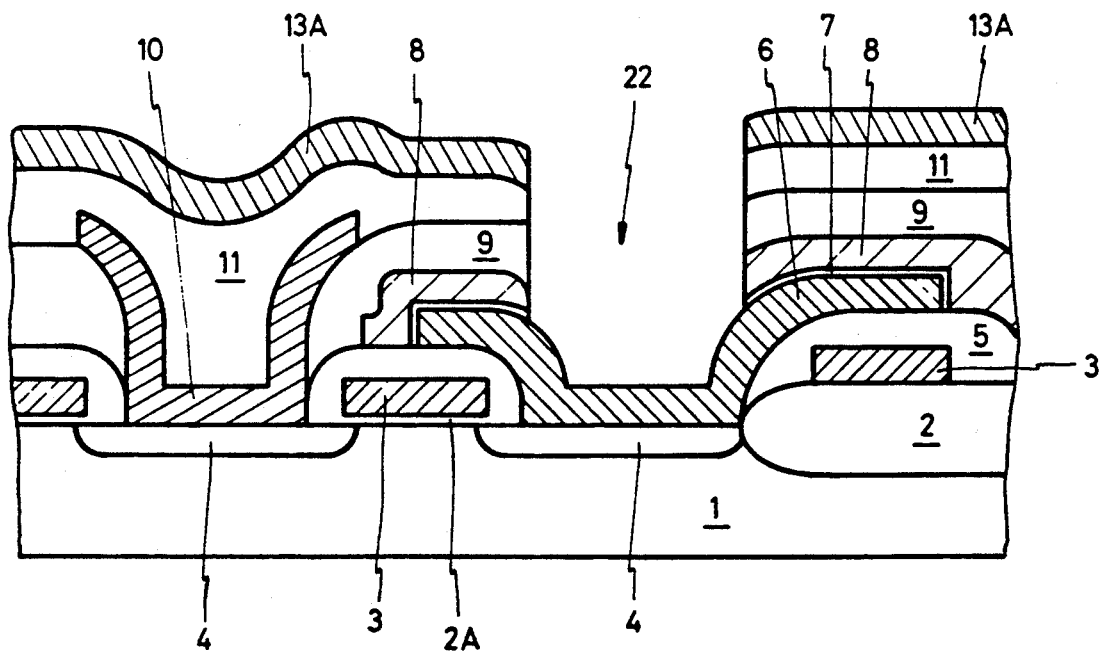
FIGS. 3A through 3C depict portions of the process steps for the manufacture of a semiconductor memory device having a double-stacked capacitor structure, in accordance with the second embodiment of the present invention.
Figure 3B:
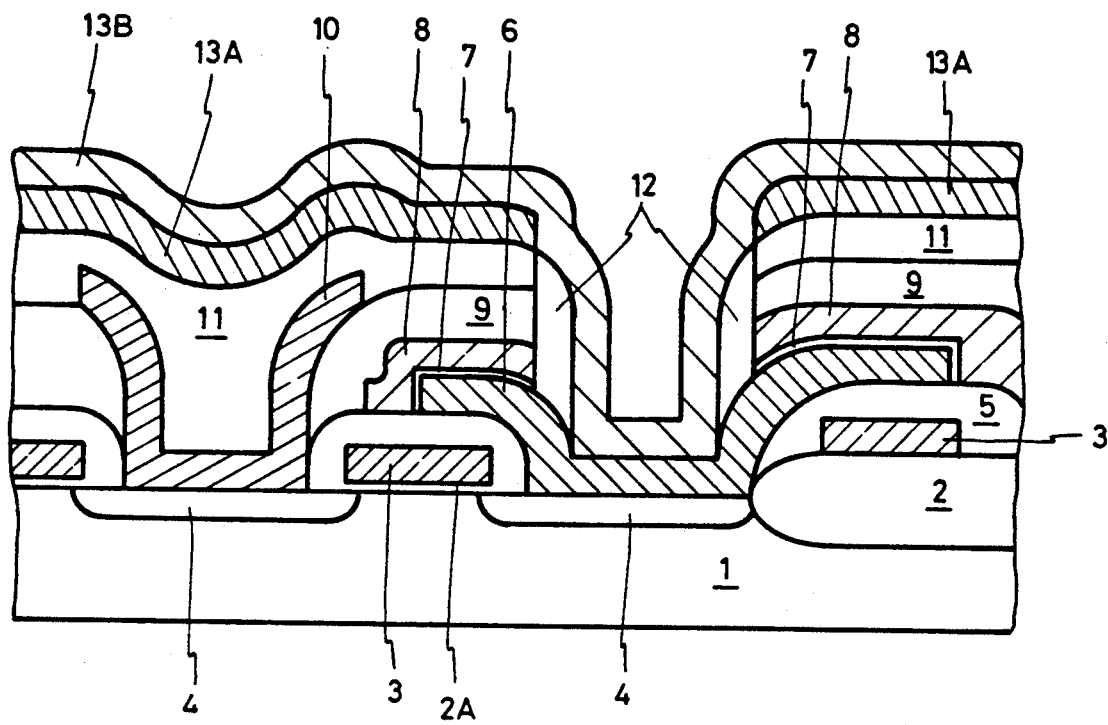
Figure 3C:
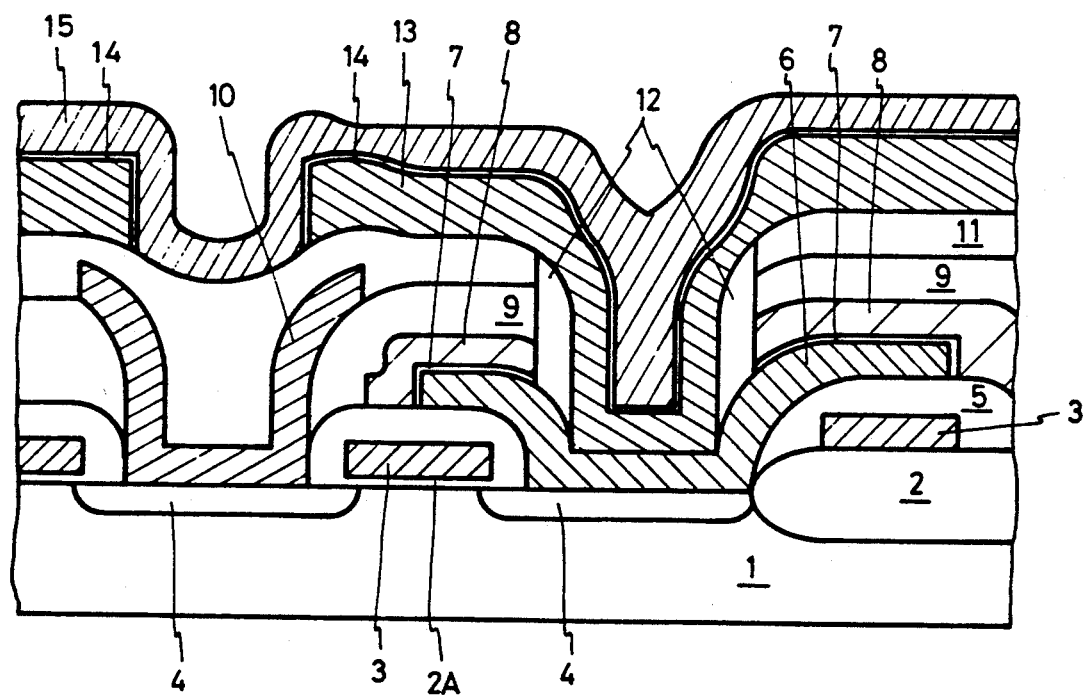
Figure 4:
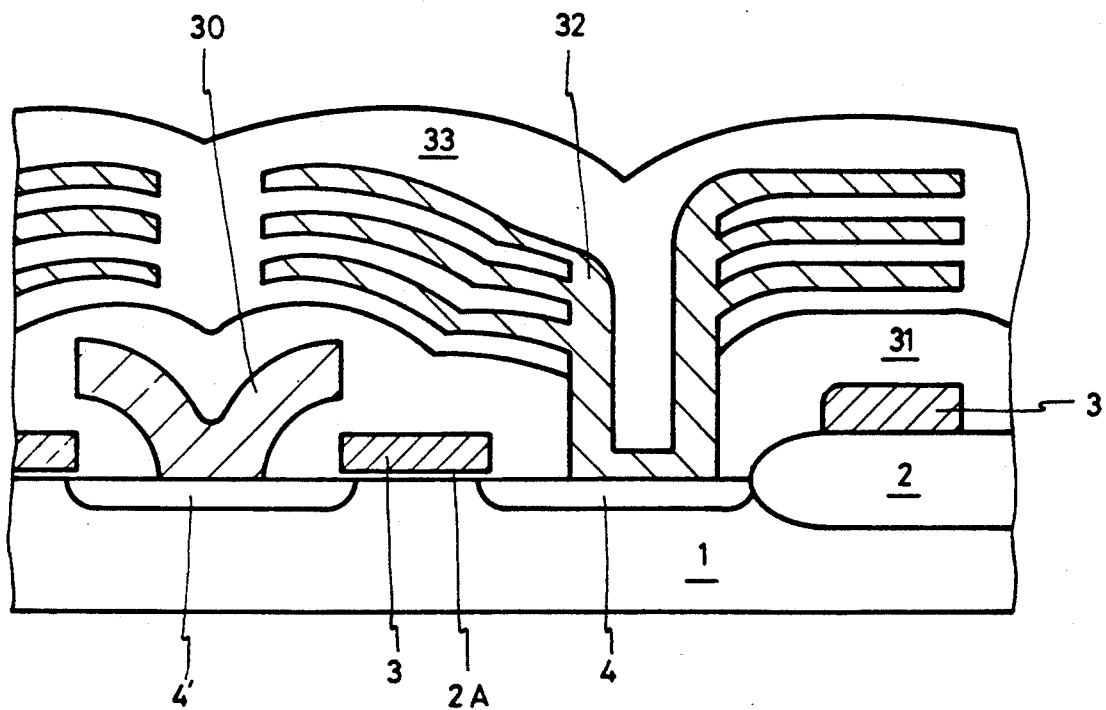
FIG. 4 illustrates a cross-section of the prior art 3-dimensional stacked capacitor for 16 mega byte DRAM and 64 mega byte DRAM.

FIGS. 3A through FIG. 3C illustrate certain of the process steps for the maufacture of a semiconductor memory device having a double stacked-capacitor, in accordance with the second embodiment of the present invention. Said embodiment first includes the process steps illustrated in FIGS. 2A through FIG. 2C.

After the process step as shown in FIG. 2C, a silicon layer 13A for the second charge storage electrode is formed on the third insulating layer 11. Thereafter, the portions of the silicon layer 13A for the second charge storage electrode, of the third insulating layer 11, of the second insulating layer 9, of the first plate electrode 8 and of the first capacitor dielectric layer 7, over the first charge storage electrode are etched into sequentially to expose the first charge storage electrode 6, thereby forming a third contact hole 22 as shown in FIG. 3A.

Referring to FIG. 3B, an insulating layer for spacer is deposited over the third contact hole 22. Thereafter, a desired portion of the insulating layer for spacer is removed via an etch-back process so that an insulating spacer 12 is formed on the side walls of the third contact hole 22. Next, a conductive layer 13B for the second charge storage electrode, in contact with the first charge storage electrode, is deposited, through the third contact hole, over the silicon layer for the second charge storage electrode. The insulating spacer 12 insulates the first plate electrode 8 from the second charge storage electrode 13.

FIG. 3C illustrates a semiconductor memory device having a double-stacked capacitor, in accordance with the second embodiment of the present invention. Referring to FIG. 3C, the desired portion of the conductive layer 13B for the second charge storage electrode and the desired portion of the silicon layer 13A for the second charge storage electrode shown in FIG. 3B are removed so that the second charge storage electrode 13 is formed. Next, a second capacitor dielectric layer 14 and a second plate electrode 15, sequentially, are formed on the second charge storage electrode 13, thereby forming a second (second-stacked) capacitor.

At this time, the second charge storage electrode 13 is connected to the source electrode 4 electrically through the first charge storage electrode 6.

As described above, according to the present invention, when a semiconductor memory device having a double-stacked capacitor is manufactured, the capacity of the capacitor is increased and the bit line contact and the second charge storage electrode contact are properly obtained without any problems arising due to a step occurring.

Although this invention has been described with its preferred forms of manufacture and in its preferred final form, with a certain degree of particularity, it will be appreciated by those skilled in the art that the present disclosure of the said preferred forms has been made only by way of example and that numerous changes in the details of parts and of method portions may be resorted to without departing from the spirit and scope of the invention.

What is claimed is:

1. A semiconductor memory device having a double-stacked capacitor structure, comprising:

MOSFETs each with a gate electrode, a source electrode and a drain electrode formed on a substrate;

a first charge storage electrode in contact with a source electrode of said MOSFETs through a first contact hole, and extended over a part of said gate electrode, with an insulating layer between said first charge storage electrode and the MOSFETs;

a first of two stacked capacitors, said first capacitor having a first dielectric layer and a first plate electrode sequentially formed over said first charge storage electrode;

a second and third insulating layer sequentially formed over said first plate electrode, with a bit line formed between said second insulating layer and said third insulating layer, said bit line being in contact with a drain electrode of said MOSFETs through a second contact hole;

a third contact hole formed over said first charge storage electrode by removing a part of said second and third insulating layer, of said first plate electrode, and of said first dielectric layer;

a second charge storage electrode formed over said third insulating layer and in contact with said first charge storage electrode through said third contact hole; and a second stacked capacitor having a second dielectric layer and a second plate electrode sequentially formed over said second charge storage electrode, whereby a first and a second capacitor connected are formed in parallel respectively below and over said bit line.

2. A semiconductor memory device having a double-stacked capacitor structure as claimed in claim 1, wherein said bit line does not overlap the active region of said MOSFETs except the part of the bit line to be placed in contact with said drain electrode.

* * * * *